US006822886B2

(12) United States Patent
Regev

(10) Patent No.: US 6,822,886 B2
(45) Date of Patent: Nov. 23, 2004

(54) REDUCING SIGNAL SWING IN A MATCH DETECTION CIRCUIT

(75) Inventor: Alon Regev, Woodland Hills, CA (US)

(73) Assignee: Micron Technology, Inc., Boise, ID (US)

( * ) Notice: Subject to any disclaimer, the term of this patent is extended or adjusted under 35 U.S.C. 154(b) by 177 days.

(21) Appl. No.: 10/166,696

(22) Filed: Jun. 12, 2002

(65) Prior Publication Data

US 2003/0058673 A1 Mar. 27, 2003

Related U.S. Application Data

(60) Provisional application No. 60/324,365, filed on Sep. 24, 2001.

(51) Int. Cl.[7] ......................... G11C 15/00; G11C 11/00; G11C 7/00; G11C 8/00
(52) U.S. Cl. .................... 365/49; 365/154; 365/189.07; 365/189.09; 365/189.11; 365/230; 365/233.5
(58) Field of Search ......................... 365/49, 108, 154, 365/203, 189.02, 189.07, 189.09, 189.11, 200, 233.5

(56) References Cited

U.S. PATENT DOCUMENTS

| 5,453,948 | A | * | 9/1995 | Yoneda ........................ 365/49 |
| 6,101,115 | A | | 8/2000 | Ross |
| 6,236,585 | B1 | * | 5/2001 | Hill ........................ 365/189.05 |
| 6,240,000 | B1 | * | 5/2001 | Sywyk et al. .................. 365/49 |
| 6,240,001 | B1 | | 5/2001 | Ross |
| 6,349,049 | B1 | | 2/2002 | Schoy |
| 6,400,592 | B1 | * | 6/2002 | Peterson ........................ 365/49 |
| 6,421,265 | B1 | * | 7/2002 | Lien et al. .................... 365/49 |
| 6,430,073 | B1 | * | 8/2002 | Batson et al. .................. 365/49 |
| 6,505,270 | B1 | * | 1/2003 | Voelkel et al. .............. 711/108 |
| 2001/0026464 | A1 | * | 10/2001 | Hata et al. .................... 365/49 |
| 2002/0044475 | A1 | * | 4/2002 | Lines et al. .................... 365/49 |
| 2002/0062433 | A1 | * | 5/2002 | Suzuki ........................ 711/203 |
| 2002/0067632 | A1 | * | 6/2002 | Batson et al. .................. 365/49 |
| 2002/0131288 | A1 | * | 9/2002 | Takahashi et al. ............. 365/49 |
| 2003/0007381 | A1 | * | 1/2003 | Regev ........................ 365/154 |
| 2003/0112648 | A1 | * | 6/2003 | Chadwick et al. ............. 365/49 |
| 2003/0198071 | A1 | * | 10/2003 | Towler et al. ................. 365/49 |
| 2004/0037104 | A1 | * | 2/2004 | Loughmiller ................. 365/49 |
| 2004/0100811 | A1 | * | 5/2004 | Pereira et al. ................. 365/49 |

OTHER PUBLICATIONS

"Half-$V_{DD}$ Bit–Line Sensing Scheme in CMOS DRAM's," Nicky Chau–Chun Lu et al., IEEE Journal of Solid–State Circuits, vol. SC–19, No. 4, Aug. 1984, pp. 451–454.

"A 256M DRAM with Simplified Register Control for Low Power Self Refresh and Rapid Burn–in," Seung–Moon Yoo et al., 1994 Symposium on VLSI Circuits Digest of Technical Papers, pp. 85 and 86.

"Automatic Voltage–Swing Reduction (AVR) Scheme for Ultra Low Power DRAM's," Masaki Tsukude et al., 1994 Symposium on VLSI Circuits Digest of Technical Papers, pp. 87 and 88.

"A 250mV Bit–Line Swing Scheme for a 1V 4Gb DRAM," T. Inaba et al., 1995 Symposium on VLSI Circuits Digest of Technical Papers, pp. 99 and 100.

* cited by examiner

Primary Examiner—David Nelms
Assistant Examiner—Long Tran
(74) Attorney, Agent, or Firm—Dickstein Shapiro Morin & Oshinsky LLP

(57) ABSTRACT

The present invention provides a content addressable memory (CAM) match detection circuit that maintains traditionally achieved levels of accuracy while greatly reducing the amount of power dissipated. In accordance with an exemplary embodiment of the invention, rather than allowing the Matchline voltage to swing between a precharge voltage level (e.g., VDD) and Ground, the Matchline voltage is restricted to swinging between the precharge voltage level (e.g., VDD) and a Negative Reference voltage level that is lower than the precharge voltage level but higher than Ground.

42 Claims, 8 Drawing Sheets

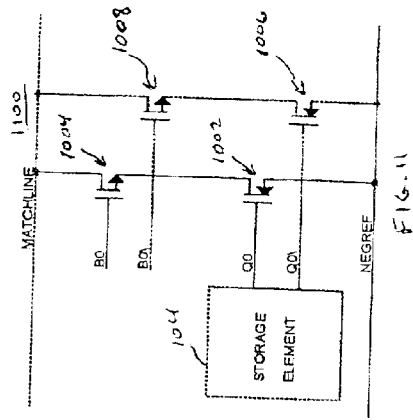
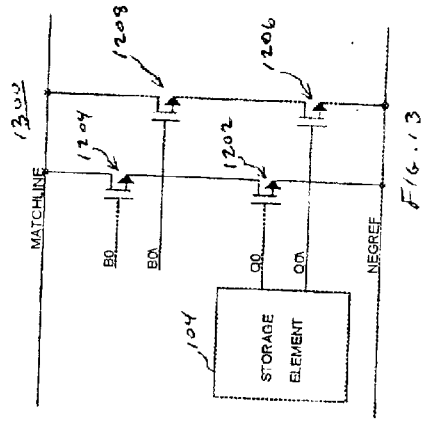
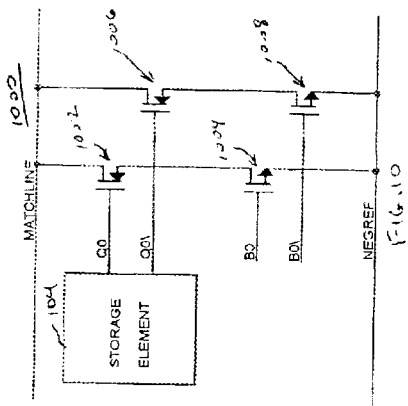
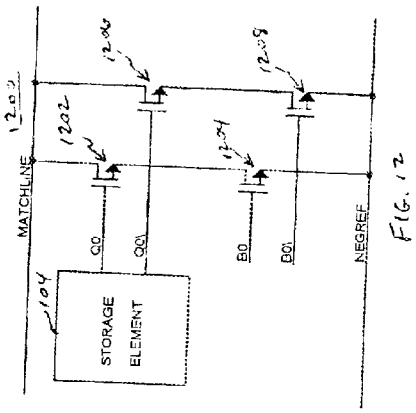

US 6,822,886 B2

REDUCING SIGNAL SWING IN A MATCH DETECTION CIRCUIT

This application claims the benefit of U.S. Provisional Application No. 60/324,365 filed Sep. 24, 2001, the content of which is incorporated herein in its entirety.

FIELD OF THE INVENTION

The present invention relates generally to semiconductor memory, and more particularly to a match detection circuit for a content addressable memory.

BACKGROUND OF THE INVENTION

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data being stored within a given memory location) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., random access memory (RAM), dynamic RAM (DRAM), etc.). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has a pair of status bits that keep track of whether the location is storing valid information in it or is empty and available for writing.

Once information is stored in a memory location, it is found by comparing every bit in memory with data placed in a match detection circuit. When the content stored in the CAM memory location does not match the data placed in the match detection circuit, the CAM device returns a no match indication. When the content stored in the CAM memory location matches the data placed in the match detection circuit, the CAM device returns a match indication. In addition, the CAM may return the identification of the address location in which the desired data is stored. Thus, with a CAM, the user supplies the data and gets back the address if there is a match found in memory.

Locally, CAMs perform an exclusive-NOR (XNOR) function, so that a match is indicated only if both the stored bit and the corresponding input bit are the same state. CAMs are designed so that any number of stored bits may be simultaneously detected for a match with the input bits in the match detection circuit. One way in which this is achieved is by coupling a plurality of storage devices and logic circuits to a common Matchline, as depicted in FIG. 1.

Turning to FIG. 1, a schematic diagram of a conventional match detection circuit 100 is depicted. A first source/drain terminal of a precharge transistor 102 is coupled to a positive voltage source (e.g., VDD). The gate of transistor 102 is coupled to a signal line 138 for receiving a Precharge signal. A second source/drain terminal of transistor 102 is coupled to a Matchline 140 for precharging the Matchline 140 to a predetermined voltage level (e.g., VDD).

Respective outputs $Q_0$, $Q_1$, $Q_{n-1}$ of storage elements 104, 114, 124, which are to be respectively compared with the input bits $B_0$, $B_1$, $B_{n-1}$ are respectively coupled to gates of transistors 106, 116 and 126. First respective source/drain terminals of transistors 106, 116 and 126 are coupled to the Matchline 140.

Second respective source/drain terminals of transistors 106, 116 and 126 are respectively coupled to transistors 110, 120 and 130. Second respective source/drain terminals of transistors 110, 120 and 130 are coupled to ground. The gates of transistors 110, 120 and 130 are respectively coupled to complements $B_0'$, $B_1'$ and $B_{n-1}'$ of the respective input bits.

Further, the respective complements of the outputs $Q_0$40, $Q_1'$ and $Q_{n-1}'$ of the storage elements 104, 114 and 124 are respectively coupled to gates of transistors 108, 118 and 128. First respective source/drain terminals of transistors 108, 118 and 128 are coupled to the Matchline 140. Second source/drain terminals of transistors 108, 118 and 128 are respectively coupled to first source/drain terminals of transistors 112, 122 and 132. Second respective source/drain terminals of transistors 112, 122 and 132 are coupled to ground. The gates of transistors 112, 122 and 132 are respectively coupled to the input bits $B_0$, $B_1$, and $B_{n-1}$ to be respectively compared with the complements $Q_0'$, $Q_1'$ and $Q_{n-1}'$ of the stored bits being stored in storage elements 104, 114 and 124.

Also coupled to the Matchline 140 is a buffer 136 for buffering the Matchline 140 voltage and for outputting the Match signal. A Match signal of logic HIGH (e.g., VDD) represents that an exact match was detected between the input bits $B_0$, $B_1$, $B_{n-1}$ and the stored bits $Q_0$, $Q_1$, $Q_{n-1}$. A Match signal of logic LOW (e.g., Ground) represents that at least one bit of the stored bits did not match its corresponding input bit causing the Matchline to be pulled to Ground. Capacitor 134 represent the parasitic capacitance of the Matchline 140 that is precharged to the initial predetermined value (e.g., VDD).

During operation of the FIG. 1 match detection circuit 100, the Precharge signal goes logic HIGH then logic LOW in order to precharge the Matchline 140 to VDD. The state of the stored bits $Q_0$, $Q_1$, $Q_{n-1}$ stored by the respective storage elements 104, 114, 124 and their complements $Q_0'$, $Q_1'$, $Q_{n-1}'$ are respectively coupled to the gates of p-type transistors 106, 116, 126, 108, 118, 128. Consequently, depending upon the states at their respective gates, the transistors 106, 116, 126, 108, 118, 128 may become active and conduct.

Similarly, the state of the input bits $B_0$, $B_1$, $B_{n-1}$ and their complements $B_0'$, $B_1'$, $B_{n-1}'$ are coupled to the gates of p-type transistors 112, 122, 132, 110, 120, 130. Consequently, depending upon the states at their respective gates, the transistors 112, 122, 132, 110, 120, 130 may become active and conduct.

When a match is detected, at least one transistor of each serially connected pair of transistors (e.g., 106 and 110, 108 and 112, etc.) is inactive and not conducting. Therefore, when the Matchline 140 remains logic HIGH, this signifies to the outside world that a match has been detected and potentially enables any other functions desired when a match is detected (e.g., provide the user with the address of the memory location where the match was found, forward the data to another location, etc.).

However, when a mismatch is detected, as is most often the case during a search for a particular bit pattern, at least one pair of serially connected transistors (e.g., 106 and 110)

is active and conducting and the Matchline 140 is coupled to Ground. When the Matchline 140 is coupled to Ground, the Match signal goes logic LOW and signifies to the outside world that a mismatch has been detected in this particular series of storage elements 104, 114, 124.

In the above-identified search process, the searched data (i.e., the input bits) is simultaneously compared with every data word in the CAM in order to find a match between the stored data and the input data. Since the comparison operation is conducted simultaneously on the entire memory, and is typically repeated at a very high frequency, this operation consumes a significant amount of power.

Power dissipation, P, in complementary metal-oxide semiconductor (CMOS) circuits, such as that depicted in FIG. 1, is related to the magnitude of signal swing, V, the load capacitance C, and the frequency of operation F as $P=C*F*V^2$. Since the magnitude of signal swing, V, for typical match detection circuits is from VDD to Ground, the power dissipated by the circuit is exceedingly high. Therefore, it is desirable to find a way to reduce power dissipation of CAM match detection circuits while maintaining the same levels of accuracy.

BRIEF SUMMARY OF THE INVENTION

The present invention provides a CAM match detection circuit that maintains traditionally achieved levels of accuracy while greatly reducing the amount of power dissipated. In accordance with an exemplary embodiment of the invention, rather than allowing the Matchline 140 voltage to swing between a precharge voltage level (e.g., VDD) and Ground, the Matchline voltage is restricted to swinging between the precharge voltage level (e.g., VDD) and a Negative Reference voltage level that is lower than the precharge voltage level but higher than Ground.

BRIEF DESCRIPTION OF THE DRAWINGS

The above and other features and advantages of the invention will be more readily understood from the following detailed description of the invention which is provided in connection with the accompanying drawings.

FIG. 10 depicts a portion of the FIG. 2 match detection circuit, in accordance with another exemplary embodiment of the invention;

FIG. 11 depicts the FIG. 10 match detection circuit, in accordance with another exemplary embodiment of the invention;

FIG. 12 depicts a portion of the FIG. 2 match detection circuit, in accordance with another exemplary embodiment of the invention; and FIG. 13 depicts the FIG. 12 match detection circuit, in accordance with another exemplary embodiment of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
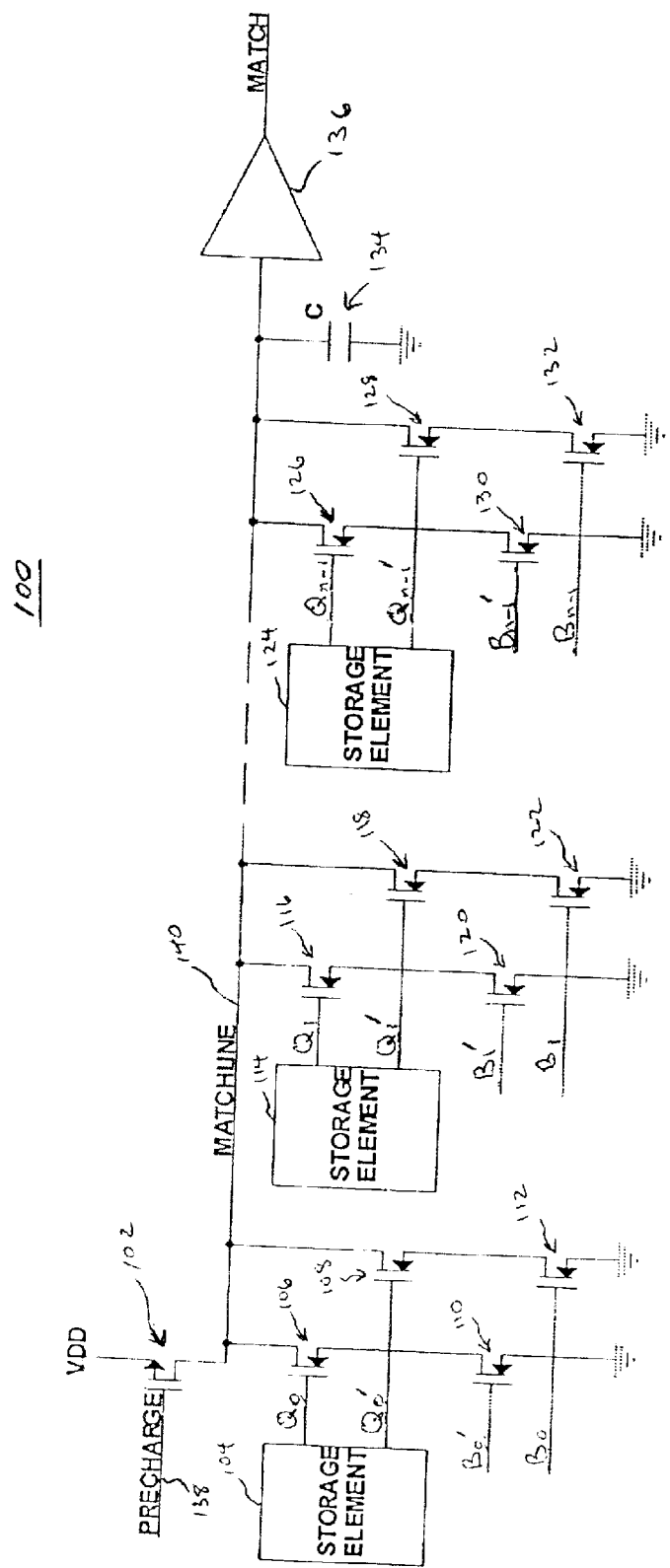
FIG. 1 is a simplified schematic diagram of a conventional match detection circuit.
Figure 2:
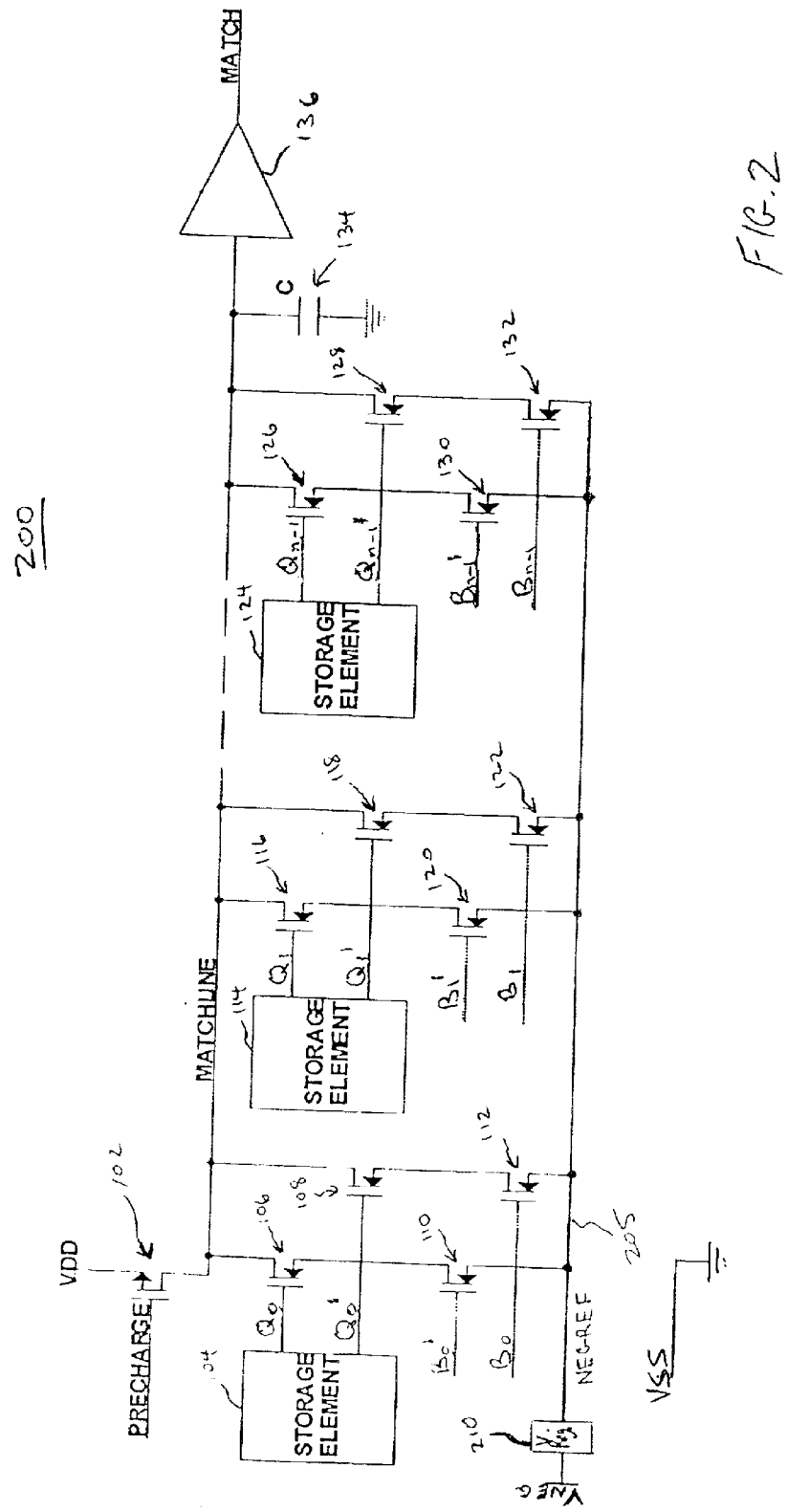
FIG. 2 is a simplified schematic diagram of a match detection circuit, in accordance with an exemplary embodiment of the invention.

FIG. 2 depicts a simplified schematic diagram of a CAM match detection circuit 200, in accordance with an exemplary embodiment of the invention. The configuration of the FIG. 2 match detection circuit 200 differs from that of the FIG. 1 match detection circuit 100 in that the respective second source/drain terminals of transistors 110, 112, 120, 122, 130 and 132 are coupled to a common Negative Reference NEGREF voltage line 205, rather than to Ground.

The storage elements 104, 114, 124 may be any complementary storage element, e.g., a flip-flop storage element, known in the art that provides a logic state of the stored value and its complementary logic state (e.g., $Q_0$ and $Q_0'$).

The operation of the FIG. 2 match detection circuit 200 differs from that of the FIG. 1 match detection circuit 100 in that the Matchline 140 voltage swings from the precharge voltage (e.g., VDD) to a Negative Reference voltage NEGREF level when a mismatch is detected. The Negative Reference voltage NEGREF level is supplied on NEGREF line 205 and is a predetermined voltage level between Ground and the precharge voltage (e.g., VDD).

The Negative Reference NEGREF voltage can be supplied from an independent power source $V_{NEG}$ external to the CAM that is regulated with a voltage regulator 210 to deliver a desired voltage level. Voltage regulator 210 may be, for example, a standard voltage regulator such as a 7905 3-terminal negative voltage regulator.

It should be noted that the present invention does not supplant the Ground connection to the CAM. For example, as depicted in FIG. 2, the Ground connection is still in tact and coupled to VSS. In accordance with an exemplary embodiment of the invention, the CAM match detection circuit 200 is modified such that when a mismatch is detected, the Matchline 140 is driven to a voltage higher than Ground so as to reduce the magnitude of the voltage swing. The reduction in the magnitude of the voltage swing results in exponentially reduced power dissipation levels.

It is desirable to complete the precharging of the Matchline 140 prior to the time when the input bits $B_0$, $B_1$, $B_{n-1}$ are respectively received at transistors 112, 122 and 132. This ensures that the Matchline 140 is sufficiently charged to its logic HIGH state before the comparison is made between the stored bits and the input bits.

Figure 3:
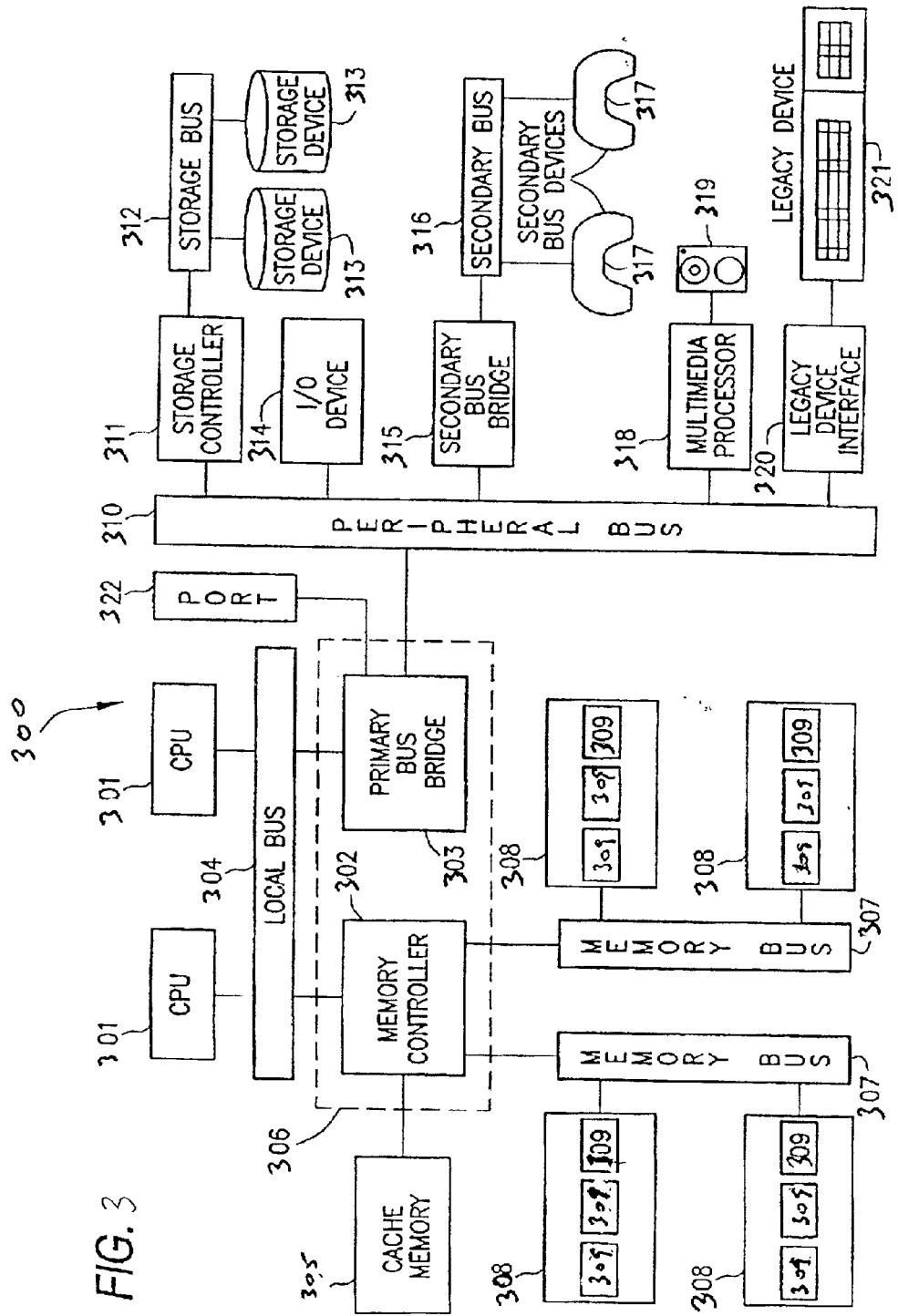
FIG. 3 is a schematic diagram of a processor system employing the match detection circuit of FIG. 2, in accordance with an exemplary embodiment of the invention.

FIG. 3 illustrates an exemplary processing system 300 which utilizes the FIG. 2 CAM match detection circuit. The processing system 300 includes one or more processors 301 coupled to a local bus 304. A memory controller 302 and a primary bus bridge 303 are also coupled the local bus 304. The processing system 300 may include multiple memory controllers 302 and/or multiple primary bus bridges 303. The memory controller 302 and the primary bus bridge 303 may be integrated as a single device 306.

The memory controller 302 is also coupled to one or more memory buses 307. Each memory bus accepts memory components 308. Any one of memory components 308 may contain a CAM array containing a match detection circuit such as the match detection circuit 200 described in connection with FIG. 2.

The memory components 308 may be a memory card or a memory module. The memory components 308 may include one or more additional devices 309. For example, in a SIMM or DIMM, the additional device 309 might be a configuration memory, such as a serial presence detect (SPD) memory. The memory controller 302 may also be coupled to a cache memory 305. The cache memory 305 may be the only cache memory in the processing system. Alternatively, other devices, for example, processors 301 may also include cache memories, which may form a cache hierarchy with cache memory 305. If the processing system 300 include peripherals or controllers which are bus masters or which support direct memory access (DMA), the memory controller 302 may implement a cache coherency protocol. If the memory controller 302 is coupled to a plurality of memory buses 307, each memory bus 307 may be operated in parallel, or different address ranges may be mapped to different memory buses 307.

The primary bus bridge 303 is coupled to at least one peripheral bus 310. Various devices, such as peripherals or additional bus bridges may be coupled to the peripheral bus 310. These devices may include a storage controller 311, an miscellaneous I/O device 314, a secondary bus bridge 315, a multimedia processor 318, and an legacy device interface 320. The primary bus bridge 303 may also coupled to one or more special purpose high speed ports 322. In a personal computer, for example, the special purpose port might be the Accelerated Graphics Port (AGP), used to couple a high performance video card to the processing system 300.

The storage controller 311 couples one or more storage devices 313, via a storage bus 312, to the peripheral bus 310. For example, the storage controller 311 may be a SCSI controller and storage devices 313 may be SCSI discs. The I/O device 314 may be any sort of peripheral. For example, the I/O device 314 may be an local area network interface, such as an Ethernet card. The secondary bus bridge may be used to interface additional devices via another bus to the processing system. For example, the secondary bus bridge may be an universal serial port (USB) controller used to couple USB devices 317 via to the processing system 300. The multimedia processor 318 may be a sound card, a video capture card, or any other type of media interface, which may also be coupled to one additional devices such as speakers 319. The legacy device interface 320 is used to couple legacy devices, for example, older styled keyboards and mice, to the processing system 300.

The processing system 300 illustrated in FIG. 3 is only an exemplary processing system with which the invention may be used. While FIG. 3 illustrates a processing architecture especially suitable for a general purpose computer, such as a personal computer or a workstation, it should be recognized that well known modifications can be made to configure the processing system 300 to become more suitable for use in a variety of applications. For example, many electronic devices which require processing may be implemented using a simpler architecture which relies on a CPU 301 coupled to memory components 308 and/or memory devices 309. The modifications may include, for example, elimination of unnecessary components, addition of specialized devices or circuits, and/or integration of a plurality of devices.

Figure 4:
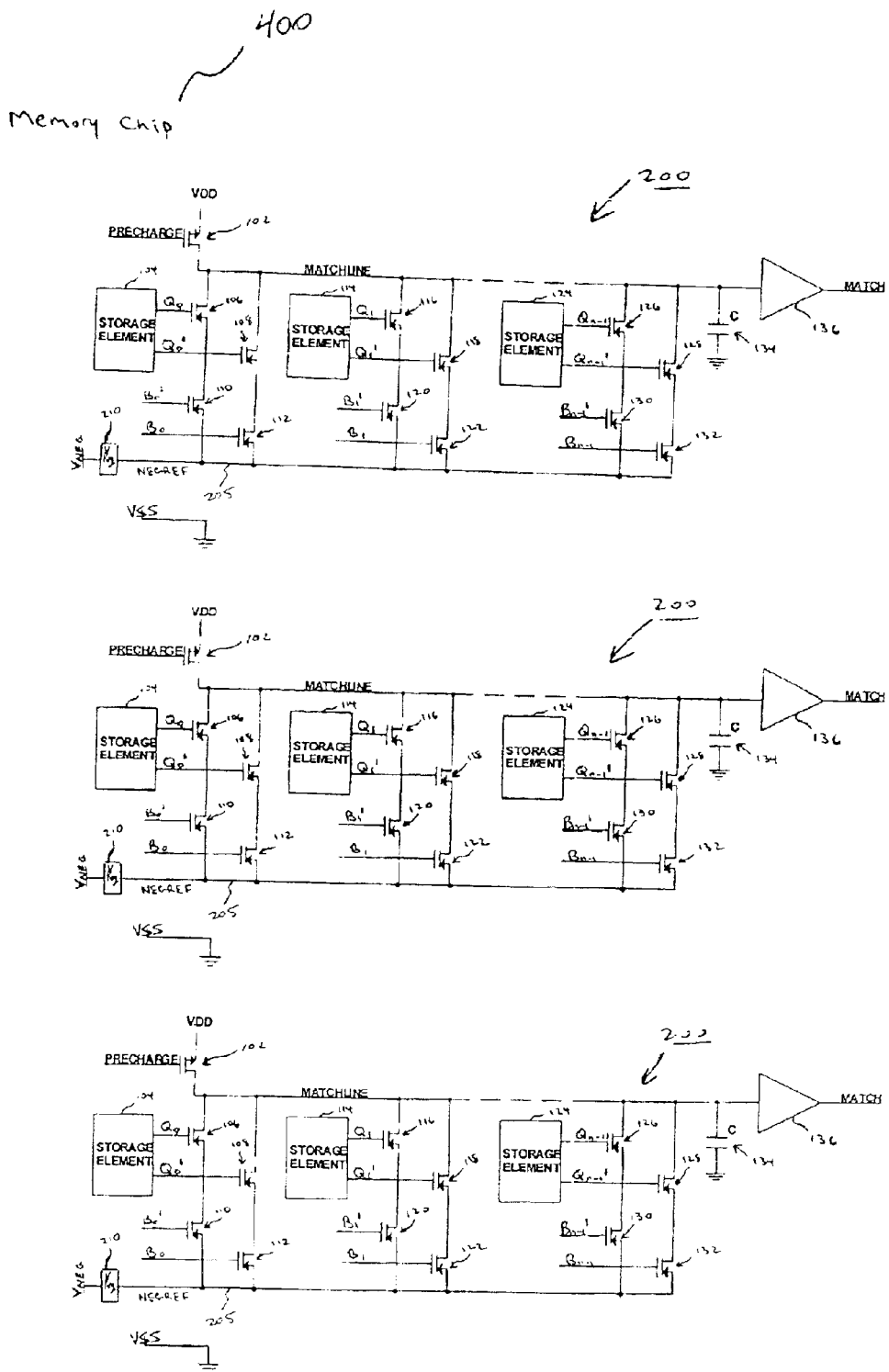
FIG. 4 illustrates a memory chip containing a CAM array that employs a plurality of FIG. 2 match detection circuits.

FIG. 4 depicts a CAM array employing a plurality of match detection circuits 200 such as the one depicted in FIG. 2. The CAM array may be included on a semiconductor memory chip 400 so that it may be incorporated into a processor system such as the one depicted in FIG. 3.

Figure 5:
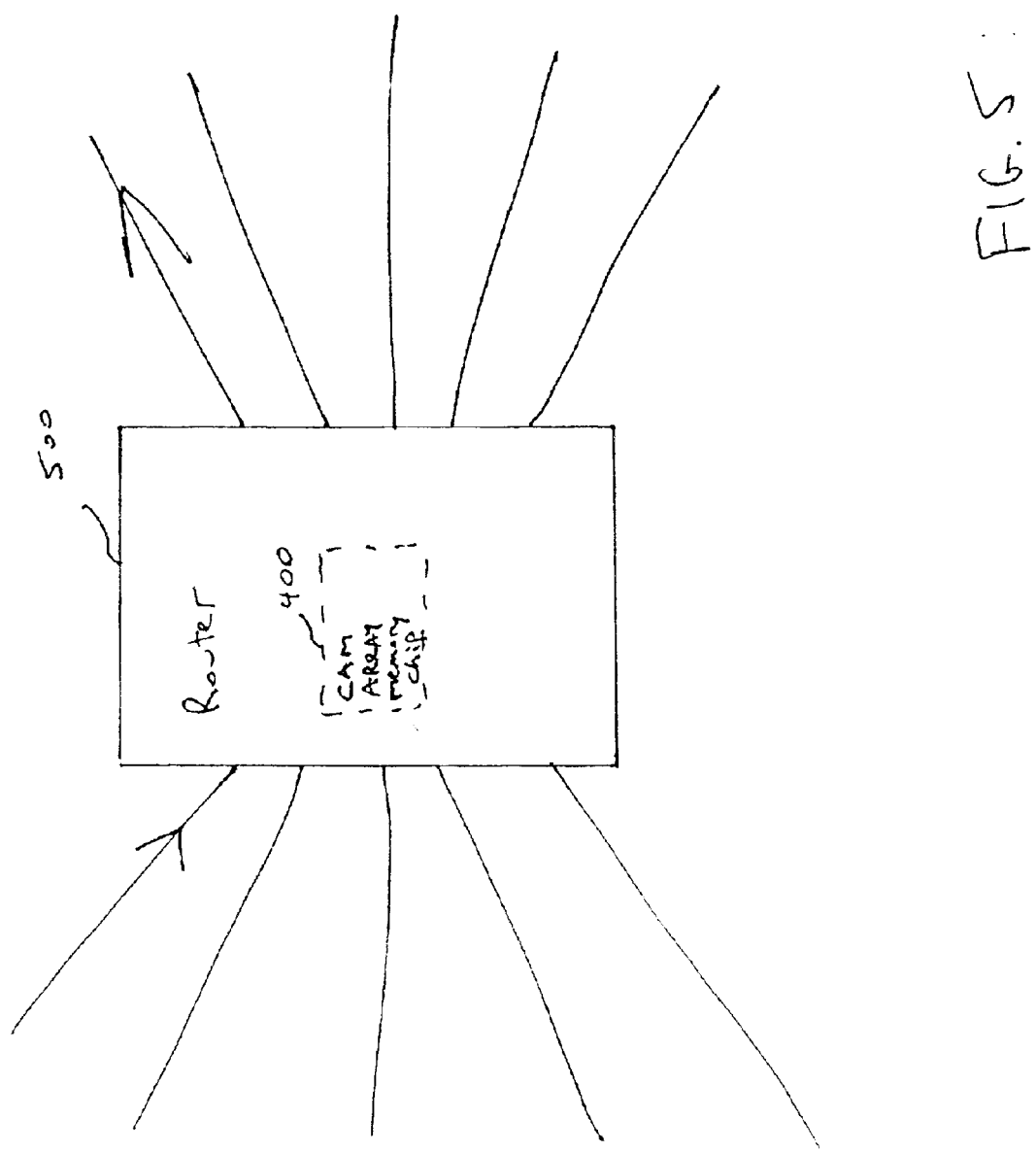
FIG. 5 depicts a simplified block diagram of a router employing the FIG. 4 memory chip containing a CAM array.

FIG. 5 is a simplified block diagram of a router 500 as may be used in a communications network, such as, e.g., part of the Internet backbone. The router 500 contains a plurality of input lines and a plurality of output lines. When data is transmitted from one location to another, it is sent in a form known as a packet. Oftentimes, prior to the packet reaching its final destination, that packet is first received by a router, or some other device. The router 500 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 500, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 5, router 500 contains the added benefit of employing a semiconductor memory chip containing a CAM array, such as that depicted in FIG. 4. Therefore, not only does the router benefit from having a CAM but also benefits by having a CAM with reduced power dissipation, in accordance with an exemplary embodiment of the invention.

Figure 6:
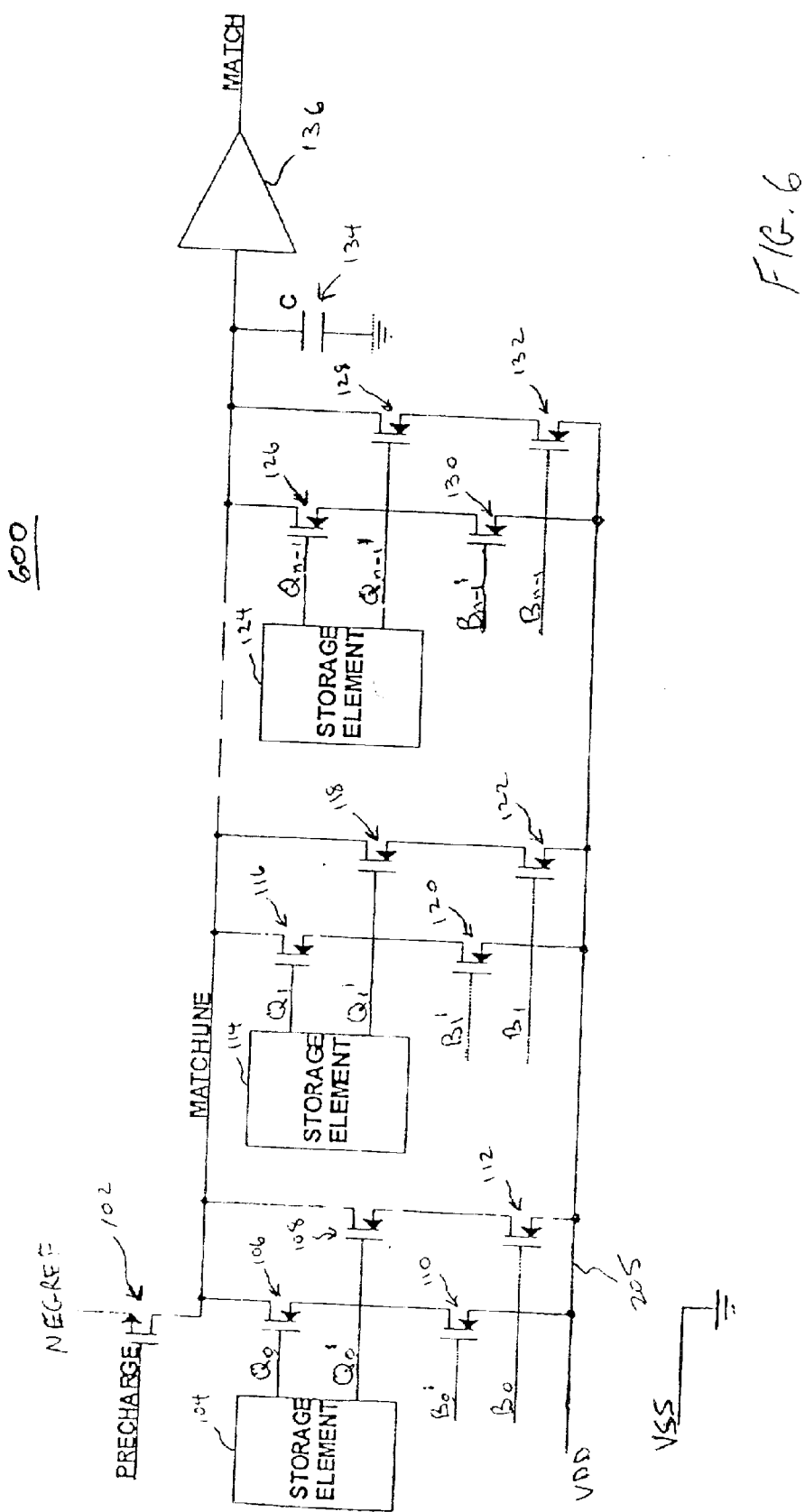
FIG. 6 depicts a match detection circuit, in accordance with an exemplary embodiment of the invention.

Turning to FIG. 6, another exemplary embodiment of the invention is depicted. The FIG. 6 match detection circuit 600 differs from the FIG. 2 match detection circuit 200 in that the matchline is precharged to NEGREF, rather than VDD. When a mismatch is detected between a stored bit and an input bit, the matchline is boosted to VDD, rather than NEGREF. In accordance with this exemplary embodiment of the invention, the FIG. 6 match detection circuit 600 has a reduced signal swing as compared with the FIG. 1 match detection circuit 100.

Figure 7:
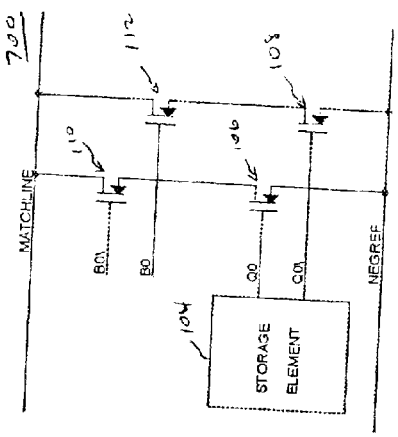
FIG. 7 depicts a portion of the FIG. 2 match detection circuit, in accordance with an exemplary embodiment of the invention.

Turning to FIG. 7, a portion 700 of the FIG. 2 match detection circuit 200 is depicted to show another orientation of the storage element (e.g., 104) and the input bit (e.g., $B_0$). The operation of the FIG. 7 embodiment is identical to that of the FIG. 2 match detection circuit 200.

Figure 8:
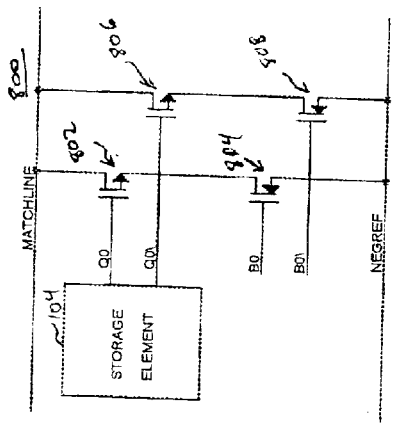
FIG. 8 depicts a portion of the FIG. 2 match detection circuit, in accordance with another exemplary embodiment of the invention.

Turning to FIG. 8, a portion 800 of the FIG. 2 match detection circuit 200 is depicted to show n-type transistors 802, 806 coupled to the storage device 104. N-type transistor 802 is in series with p-type transistor 804 and n-type transistor 806 is in series with p-type transistor 808. In addition, the true logic state of the stored bit $Q_0$ and the true logic state of the input bit $B_0$ are respectively received at gates of transistors 802 and 804, while complements $Q_0$40, $B_0$' of the logic state of the stored bit and of the input bit are respectively received at gates of transistors 806 and 808.

When a mismatch is detected between the stored bit $Q_0$ and the input bit $B_0$, the matchline is brought from VDD to NEGREF.

Figure 9:
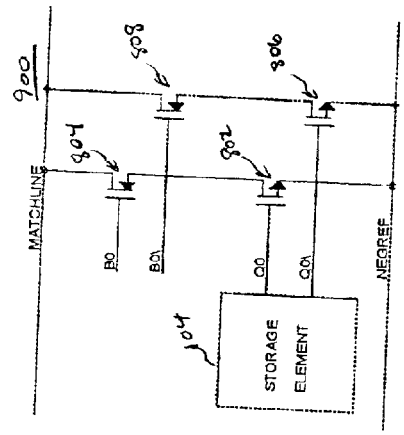
FIG. 9 depicts the FIG. 8 match detection circuit, in accordance with another exemplary embodiment of the invention.

Turing to FIG. 9, a portion 900 of the FIG. 8 match detection circuit 800 is depicted to show another orientation of the storage element 104 and the input bit $B_0$. The operation of the FIG. 9 embodiment is identical to that of the FIG. 8 embodiment.

Turning to FIG. 10, a portion 1000 of the FIG. 2 match detection circuit 200 is depicted to show n-type transistors 1004, 1008 respectively coupled to the input bit $B_0$ and its complement $B_0'$. N-type transistor 1004 is in series with p-type transistor 1002 and n-type transistor 1008 is in series with p-type transistor 1006. In addition, the true logic state of the stored bit $Q_0$ and the true logic state of the input bit $B_0$ are respectively received at gates of transistors 1002 and 1004, while complements $Q_0 40$, $B_0'$ of the logic state of the stored bit and of the input bit are respectively received at gates of transistors 1006 and 1008. When a mismatch is detected between the stored bit $Q_0$ and the input bit $B_0$, the matchline is brought from VDD to NEGREF.

Turning to FIG. 11, a portion 1100 of the FIG. 10 match detection circuit 1000 is depicted to show another orientation of the storage element 104 and the input bit $B_0$. The operation of the FIG. 11 embodiment is identical to that of the FIG. 10 embodiment.

Turning to FIG. 12, a portion 1200 of the FIG. 2 match detection circuit 200 is depicted to show n-type transistors 1202–1208 in place of p-type transistors 106–112. Here, the true logic state of the stored bit $Q_0$ as well as the true logic state of the input bit $B_0$ are respectively received at gates of series connected transistors 1202 and 1204. The complements $Q_0 40$, $B_0'$ of the logic states of the stored bit and the input bit are respectively received at gates of series connected transistors 1206, 1208. When a mismatch is detected between the stored bit $Q_0$ and the input bit $B_0$, the matchline is brought from VDD to NEGREF.

Turning to FIG. 13, a portion 1300 of the FIG. 12 match detection circuit 1200 is depicted to show another orientation of the storage element 104 and the input bit $B_0$. The operation of the FIG. 13 embodiment is identical to that of the FIG. 12 embodiment.

It is desirable to have a CAM match detection circuit 200 that dissipates less power while maintaining traditionally achieved levels of performance. The present invention accomplishes this by providing a match detection circuit 200 that reduces the magnitude of signal swing when a mismatch is detected. As illustrated by several exemplary embodiments of the invention, the Matchline voltage swings from the predetermined voltage (e.g., VDD) to the NEGREF voltage, where the NEGREF voltage is at a level higher than Ground (0v). Alternatively, in other exemplary embodiments, the matchline voltage swings from NEGREF to VDD. The reduced voltage swing during match detection greatly reduces the power dissipated by each circuit 200.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits employing different configurations of p-type and n-type transistors, the invention may be practiced with many other configurations without departing from the spirit and scope of the invention. Accordingly, the invention is not limited by the foregoing description or drawings, but is only limited by the scope of the appended claims.

What is claimed is:

1. A match detection circuit for a content addressable memory (CAM), comprising:
    a matchline configured to have a first logic state when a match is detected between a logic state of a bit stored in said CAM and a logic state of a bit received by said CAM, and configured to have a second logic state when a mismatch is detected between the logic states of said stored and received bits;
    a first voltage terminal switchably coupled to said matchline for precharging said matchline to a first voltage level representing said first logic state; and
    a second voltage terminal switchably coupled to said matchline for changing the logic state of said matchline from said first logic state to said second logic state, said second voltage terminal having a voltage level different than said first voltage level and different than a ground voltage level.

2. The circuit of claim 1 further comprising a transistor coupled between said first voltage terminal and said matchline, said transistor being activated upon receipt of a precharge signal, thereby coupling said first voltage terminal with said matchline.

3. The circuit of claim 2, wherein said first voltage terminal comprises a VDD terminal.

4. The circuit of claim 1, wherein said second voltage terminal is connected to a regulated voltage source.

5. The circuit of claim 1, wherein said CAM comprises a storage element for storing said stored bit.

6. The circuit of claim 5, wherein said storage element comprises a flip-flop for storing a true logic state of said stored bit and a complementary logic state of said stored bit.

7. The circuit of claim 5 further comprising:
    a first transistor, a gate of said first transistor coupled to said storage element for receiving said logic state of said stored bit, a first source/drain terminal of said first transistor being coupled to said matchline;
    a second transistor, a gate of said second transistor configured to receive a complement of said bit received by said CAM, a first source/drain terminal of said second transistor being coupled to a second source/drain terminal of said first transistor, and a second source/drain terminal of said second transistor being coupled to said second voltage terminal;
    a third transistor, a gate of said third transistor coupled to said storage element for receiving a complement of said logic state of said stored bit, a first source/drain terminal of said third transistor being coupled to said matchline;
    a fourth transistor, a gate of said fourth transistor being configured to receive said logic state of said bit received by said CAM, a first source/drain terminal of said fourth terminal being coupled to a second source/drain terminal of said third transistor, a second source/drain terminal of said fourth transistor being coupled to said second voltage terminal.

8. The circuit of claim 7, wherein said first through fourth transistors comprise metal oxide semiconductor (MOS) transistors.

9. The circuit of claim 8, wherein said MOS transistors comprise p-type MOS transistors.

10. The circuit of claim 8, wherein said MOS transistors comprise n-type MOS transistors.

11. A match detection circuit for a content addressable memory (CAM), comprising:
- a matchline switchably coupled between a first voltage terminal and a second voltage terminal, said first voltage terminal serving to precharge said matchline to a first voltage;
- said matchline being configured to be connected to a second voltage level of said second terminal when a logic state of a bit stored by said CAM does not match a logic state of a bit received by said CAM for comparison with said stored bit, wherein said second voltage is greater than a ground potential and wherein said second voltage is lower than said first voltage.

12. A match detection circuit for a content addressable memory (CAM), comprising:
- a plurality of stored bits to be compared with a corresponding plurality of input bits received by said CAM;
- a matchline switchably coupled between a first voltage terminal and a second voltage terminal, said first voltage terminal serving to precharge said matchline to a first voltage level prior to said stored bits and said input bits being compared;
- said matchline being coupled to said second voltage terminal when a logic state of at least one of said plurality of input bits does not match a logic state of a stored bit corresponding to said at least one input bit, said second voltage level being lower than said first voltage level and higher than a ground potential.

13. The circuit of claim 12 further comprising:
- an output for outputting a first logic state when said plurality of stored bits matches said corresponding plurality of input bits received by said CAM, and for outputting a second logic state when said plurality of stored bits does not match said corresponding plurality of input bits received by said CAM.

14. The circuit of claim 13, wherein said first logic state is logic HIGH and wherein said second logic state is logic LOW.

15. The circuit of claim 13, wherein said output comprises a buffer coupled to said matchline.

16. The circuit of claim 12, wherein said first voltage level is VDD.

17. A semiconductor memory chip, comprising:
- a plurality of match detection circuits for a content addressable memory (CAM), each of said match detection circuits comprising:
  - a matchline configured to have a first logic state when a match is detected between a logic state of a bit stored in said CAM and a logic state of a bit received by said CAM, and configured to have a second logic state when a mismatch is detected between the logic states of said stored and received bits;
  - a first voltage terminal switchably coupled to said matchline for precharging said Matchline to a first voltage level representing said first logic state; and
  - a second voltage terminal switchably coupled to said matchline for changing the logic state of said matchline from said first logic state to said second logic state, said second voltage terminal having a voltage level different than said first voltage level and different than a ground voltage level.

18. The memory chip of claim 17, each of said match detection circuits further comprising a transistor coupled between said first voltage terminal and said matchline, said transistor being activated upon receipt of a precharge signal, thereby coupling said first voltage terminal with said matchline.

19. The memory chip of claim 18, wherein said first voltage terminal comprises a VDD terminal.

20. The memory chip of claim 17, wherein said second voltage terminal is connected to a regulated voltage source.

21. The memory chip of claim 17, wherein said CAM comprises a storage element for storing said stored bit.

22. The memory chip of claim 21, wherein said storage element comprises a flip-flop for storing a true logic state of said stored bit and a complementary logic state of said stored bit.

23. The circuit of claim 21, wherein each of said match detection circuits further comprise:
- a first transistor, a gate of said first transistor coupled to said storage element for receiving said logic state of said stored bit, a first source/drain terminal of said first transistor being coupled to said matchline;
- a second transistor, a gate of said second transistor configured to receive a complement of said bit received by said CAM, a first source/drain terminal of said second transistor being coupled to a second source/drain terminal of said first transistor, and a second source/drain terminal of said second transistor being coupled to said second voltage terminal;
- a third transistor, a gate of said third transistor coupled to said storage element for receiving a complement of said logic state of said stored bit, a first source/drain terminal of said third transistor being coupled to said matchline;
- a fourth transistor, a gate of said fourth transistor being configured to receive said logic state of said bit received by said CAM, a first source/drain terminal of said fourth terminal being coupled to a second source/drain terminal of said third transistor, a second source/drain terminal of said fourth transistor being coupled to said second voltage terminal.

24. The memory chip of claim 23, wherein said first through fourth transistors comprise metal oxide semiconductor (MOS) transistors.

25. The memory chip of claim 24, wherein said MOS transistors comprise p-type MOS transistors.

26. The memory chip of claim 24, wherein said MOS transistors comprise n-type transistors.

27. A semiconductor memory chip, comprising:
- a plurality of match detection circuits for a content addressable memory (CAM), each of said match detection circuits comprising:
  - a matchline switchably coupled between a first voltage terminal and a second voltage terminal, said first voltage terminal serving to precharge said matchline to a first voltage;
  - said matchline being configured to be connected to a second voltage level of said second terminal when a logic state of a bit stored by said CAM does not match a logic state of a bit received by said CAM for comparison with said stored bit, wherein said second voltage is greater than a ground potential and wherein said second voltage is lower than said first voltage.

28. A semiconductor chip, comprising:
- a plurality of match detection circuits for a content addressable memory (CAM), each of said match detection circuits comprising:
  - a plurality of stored bits to be compared with a corresponding plurality of input bits received by said CAM;
  - a matchline switchably coupled between a first voltage terminal and a second voltage terminal, said first voltage terminal serving to precharge said matchline to a first voltage level prior to said stored bits and said input bits being compared;

said matchline being coupled to said second voltage terminal when a logic state of at least one of said plurality of input bits does not match a logic state of a stored bit corresponding to said at least one input bit, said second voltage level being lower than said first voltage level and higher than a ground potential.

29. The memory chip of claim 28, wherein each match detection circuit an output for outputting a first logic state when said plurality of stored bits matches said corresponding plurality of input bits received by said CAM, and for outputting a second logic state when said plurality of stored bits does not match said corresponding plurality of input bits received by said CAM.

30. The memory chip of claim 29, wherein said first logic state is logic HIGH and wherein said second logic state is logic LOW.

31. The memory chip of claim 29, wherein said first logic state is logic LOW and wherein said second logic state is logic HIGH.

32. A processor system, comprising:

a central processing unit;

a memory component coupled to said processor, said memory component containing a match detection circuit for a content addressable memory (CAM), said match detection circuit comprising:

a matchline configured to have a first logic state when a match is detected between a logic state of a bit stored in said CAM and a logic state of a bit received by said CAM, and configured to have a second logic state when a mismatch is detected between the logic states of said stored and received bits;

a first voltage terminal switchably coupled to said matchline for precharging said matchline to a first voltage level representing said first logic state; and a second voltage terminal switchably coupled to said matchline for changing the logic state of said matchline from said first logic state to said second logic state, said second voltage terminal having a voltage level different than said first voltage level and higher than a ground voltage level.

33. The processor system of claim 32, wherein said match detection circuit further comprises:

a transistor coupled between said first voltage terminal and said matchline, said transistor being activated upon receipt of a precharge signal, thereby coupling said first voltage terminal with said matchline.

34. The processor system of claim 33, wherein said first voltage terminal comprises a VDD terminal.

35. The processor system of claim 34, wherein said second voltage terminal is coupled to a regulated voltage source.

36. The processor system of claim 34, wherein said second voltage terminal is coupled to VDD.

37. The processor system of claim 34, wherein said CAM comprises a storage element for storing said stored bit.

38. The processor system of claim 37, wherein said storage element comprises a flip-flop for storing a true logic state of said stored bit and a complementary logic state of said stored bit.

39. The processor system of claim 33, wherein said first voltage terminal is coupled to a negative reference voltage terminal at a voltage level lower than VDD.

40. A processor system, comprising:

a central processing unit;

a memory component coupled to said processor, said memory component containing a match detection circuit for a content addressable memory (CAM), said match detection circuit comprising:

a matchline switchably coupled between a first voltage terminal and a second voltage terminal, said first voltage terminal serving to precharge said matchline to a first voltage;

said matchline being configured to be connected to a second voltage level of said second terminal when a logic state of a bit stored by said CAM does not match a logic state of a bit received by said CAM for comparison with said stored bit, wherein said second voltage is greater than a ground potential and wherein said second voltage is lower than said first voltage.

41. A router, comprising:

a plurality of message receiving inputs;

a plurality of message transmitting outputs; and a semiconductor chip containing a plurality of match detection circuits for a content addressable memory (CAM), said CAM being used to route messages on said inputs to said outputs, each of said match detection circuits comprising:

a plurality of stored bits to be compared with a corresponding plurality of input bits received by said CAM;

a matchline switchably coupled between a first voltage terminal and a second voltage terminal, said first voltage terminal serving to precharge said matchline to a first voltage level prior to said stored bits and said input bits being compared;

said matchline being coupled to said second voltage terminal when a logic state of at least one of said plurality of input bits does not match a logic state of a stored bit corresponding to said at least one input bit, said second voltage level being lower than said first voltage level and higher than a ground potential.

42. The router of claim 41, wherein each match detection circuit further comprises:

an output for outputting a first logic state when said plurality of stored bits matches said corresponding plurality of input bits received by said CAM, and for outputting a second logic state when said plurality of stored bits does not match said corresponding plurality of input bits received by said CAM.

* * * * *

UNITED STATES PATENT AND TRADEMARK OFFICE
CERTIFICATE OF CORRECTION

| | | |
|---|---|---|
| PATENT NO. | : 6,822,886 B2 | Page 1 of 2 |
| APPLICATION NO. | : 10/166696 | |
| DATED | : November 23, 2004 | |
| INVENTOR(S) | : Alon Regev | |

It is certified that error appears in the above-identified patent and that said Letters Patent is hereby corrected as shown below:

In the Specification, the following errors are corrected:

Column 2, line 14, "$Q_0 40$" should read --$Q_0'$--;

Column 2, line 36, "represent" should read --represents--;

Column 5, line 25, "include" should read --includes--;

Column 5, lines 35-36, "an miscellaneous" should read --a miscellaneous--;

Column 5, line 37, "an legacy" should read --a legacy--;

Column 5, line 38, "also coupled" should read --also be coupled--;

Column 5, line 49, "an local" should read --a local--;

Column 5, line 53, "an universal" should read --a universal--;

Column 5, line 54, "via to the" should read --via the--;

Column 5, line 57, "to one additional" should read --to additional--;

Column 6, line 65, "$Q_0 40$" should read --$Q_0'$--;

Column 7, line 17, "$Q_0 40$" should read --$Q_0'$--; and

Column 7, line 33, "$Q_0 40$" should read --$Q_0'$--.

UNITED STATES PATENT AND TRADEMARK OFFICE
CERTIFICATE OF CORRECTION

PATENT NO. : 6,822,886 B2
APPLICATION NO. : 10/166696
DATED : November 23, 2004
INVENTOR(S) : Alon Regev It is certified that error appears in the above-identified patent and that said Letters Patent is hereby corrected as shown below:

In the Claims, the following errors are corrected:

Column 10, line 12, "comprise" should read --comprises--; and

Column 11, line 11, "circuit" should read --circuit further comprises--.

Signed and Sealed this

Eighteenth Day of March, 2008

JON W. DUDAS
*Director of the United States Patent and Trademark Office*